United States Patent
Yao et al.

(10) Patent No.: US 10,453,657 B2
(45) Date of Patent: Oct. 22, 2019

(54) APPARATUS FOR DEPOSITING METAL FILMS WITH PLASMA TREATMENT

(71) Applicant: APPLIED MATERIALS, INC., Santa Clara, CA (US)

(72) Inventors: Daping Yao, San Jose, CA (US); Hyman W. H. Lam, San Jose, CA (US); John C. Forster, Mountain View, CA (US); Jiang Lu, Milpitas, CA (US); Can Xu, San Jose, CA (US); Dien-Yeh Wu, San Jose, CA (US); Paul F. Ma, Santa Clara, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 120 days.

(21) Appl. No.: 15/642,002

(22) Filed: Jul. 5, 2017

(65) Prior Publication Data
US 2018/0012732 A1   Jan. 11, 2018

Related U.S. Application Data

(60) Provisional application No. 62/360,191, filed on Jul. 8, 2016.

(51) Int. Cl.
| | |
|---|---|
| *H01J 37/32* | (2006.01) |
| *C23C 16/513* | (2006.01) |
| *C23C 16/505* | (2006.01) |
| *C23C 16/52* | (2006.01) |
| *C23C 16/455* | (2006.01) |

(Continued)

(52) U.S. Cl.
CPC ........ *H01J 37/3244* (2013.01); *C23C 16/455* (2013.01); *C23C 16/45563* (2013.01); *C23C 16/45572* (2013.01); *C23C 16/505* (2013.01); *C23C 16/509* (2013.01); *C23C 16/513* (2013.01); *C23C 16/52* (2013.01); *C23C 16/06* (2013.01); *H01J 2237/002* (2013.01);

(Continued)

(58) Field of Classification Search
CPC ............................ C23C 16/505; C23C 16/455
See application file for complete search history.

(56) References Cited

U.S. PATENT DOCUMENTS

| | | |
|---|---|---|
| 4,698,605 A | 10/1987 | Imamura et al. |
| 8,728,586 B2 | 5/2014 | Kudela |

(Continued)

FOREIGN PATENT DOCUMENTS

KR    10-1567696 B1    11/2015

OTHER PUBLICATIONS

International Search Report and Written Opinion dated Sep. 20, 2017 received for PCT Application No. PCT/US2017/041091.

*Primary Examiner* — Joseph A Miller, Jr.
(74) *Attorney, Agent, or Firm* — Moser Taboada; Alan Taboada

(57) ABSTRACT

Embodiments of a gas delivery apparatus for use in a radio frequency (RF) processing apparatus are provided herein. In some embodiments, a gas delivery apparatus for use in a radio frequency (RF) processing apparatus includes: a conductive gas line having a first end and a second end; a first flange coupled to the first end; a second flange coupled to the second end, wherein the conductive gas line extends through and between the first and second flanges; and a block of ferrite material surrounding the conductive gas line between the first and second flanges.

16 Claims, 4 Drawing Sheets

(51) Int. Cl.
  *C23C 16/509* (2006.01)
  *C23C 16/06* (2006.01)
(52) U.S. Cl.
  CPC ............... *H01J 2237/0213* (2013.01); *H01J 2237/3321* (2013.01)

(56) References Cited

U.S. PATENT DOCUMENTS

| | | | |
|---|---|---|---|
| 2009/0022905 A1* | 1/2009 | Kudela | ............... C23C 16/455 427/569 |
| 2009/0151636 A1 | 6/2009 | White et al. | |
| 2010/0194278 A1 | 8/2010 | Ouyang | |
| 2011/0165721 A1 | 11/2011 | Kao et al. | |
| 2013/0017626 A1 | 1/2013 | Tomioka | |

* cited by examiner

APPARATUS FOR DEPOSITING METAL FILMS WITH PLASMA TREATMENT

CROSS-REFERENCE TO RELATED APPLICATIONS

This application claims benefit of U.S. provisional patent application Ser. No. 62/360,191, filed Jul. 8, 2016, which is herein incorporated by reference in its entirety.

FIELD

Embodiments of the disclosure generally relate to methods and apparatus for processing a substrate.

BACKGROUND

In plasma enhanced chemical vapor deposition (PECVD) and other similar processes, process gases may be introduced into the process chamber and ignited into a plasma by an RF current applied to the process chamber. Many PECVD processes include a gas delivery line to provide one or more process gases for forming a plasma and processing substrates with the plasma of the delivered gases. As substrate sizes increase, the RF current applied to the process chamber may also increase. With the increase in RF current, the possibility of premature gas breakdown prior to the gas reaching the process chamber also undesirably increases, as does the possibility of parasitic plasma formation inside the gas delivery line. Current PECVD systems include devices such as RF chokes to reduce premature gas breakdown and parasitic plasma formation. However, the inventors have observed that the RF chokes used in current PECVD systems are not always reliable, for example, to prevent premature gas breakdown prior to the gas reaching the process chamber and ensure the absence of parasitic plasma formation inside the gas delivery line.

Therefore, the inventors have provided an improved plasma process gas delivery apparatus.

SUMMARY

Embodiments of a gas delivery apparatus for use in a radio frequency (RF) processing apparatus are provided herein. In some embodiments, a gas delivery apparatus for use in a radio frequency (RF) processing apparatus includes: a conductive gas line having a first end and a second end; a first flange coupled to the first end; a second flange coupled to the second end, wherein the conductive gas line extends through and between the first and second flanges; and a block of ferrite material surrounding the conductive gas line between the first and second flanges.

In some embodiments, an apparatus for delivering one or more process gas to a process chamber is provided herein. In some embodiments, an apparatus for delivering one or more process gas to a process chamber includes: an RF power source for providing RF current to a process chamber, wherein the RF power source is coupled to the process chamber; a gas source for providing a gas to a processing volume of the process chamber; and a gas delivery apparatus coupled between the gas source and the RF power source. The gas delivery apparatus includes: a conductive gas line having a first end and a second end; a first flange coupled to the first end and coupling the conductive gas line to the gas source; a second flange coupled to the second end and coupling the conductive gas line to the process chamber, wherein the conductive gas line extends through and between the first and second flanges; and a block of ferrite material surround the conductive gas line between the first and second flanges.

In some embodiments, a gas delivery method for providing one or more gases to a process chamber is provided herein. In some embodiments, a method for providing one or more gases to a process chamber includes: flowing a gas from a gas source to a processing volume of a process chamber through a gas delivery apparatus comprising a conductive gas line disposed in a block of ferrite material; grounding a first end of the conductive gas line; and providing an RF current to the process chamber, wherein the RF current is coupled to a second end of the conductive gas line, wherein the RF current is blocked from forming electromagnetic fields inside the conductive gas lines by the block of ferrite material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
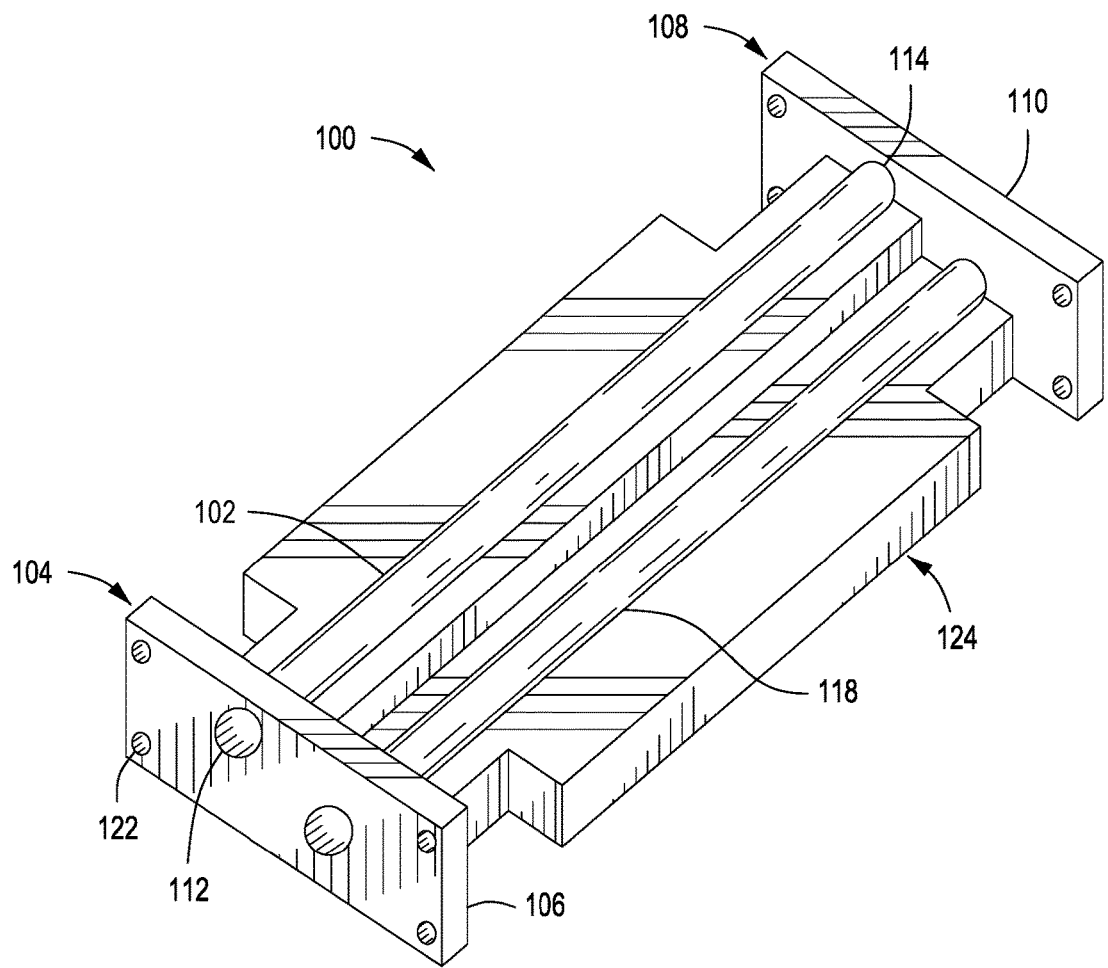
FIG. 1 depicts a top perspective view of a partially assembled gas delivery apparatus in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to a gas delivery apparatus for use in a radio frequency (RF) processing apparatus (e.g., a process chamber). Embodiments of the inventive gas delivery apparatus advantageously block RF current from forming electromagnetic fields inside gas lines of the gas delivery apparatus, thus preventing premature gas breakdown prior to the gas reaching the process chamber. The gas delivery apparatus also prevents the parasitic plasma formation within the gas delivery line.

FIG. 1 depicts a gas delivery apparatus 100 for use in a radio frequency (RF) processing apparatus (e.g., a process chamber) in accordance with some embodiments of the present disclosure. The gas delivery apparatus 100 includes an electrically conductive gas line (e.g., a first conduit 102) extending axially through the gas delivery apparatus 100 from a first end 104 of the gas delivery apparatus 100 to an opposing second end 108 of the gas delivery apparatus 100. A first flange 106 is disposed at the first end 104 of the gas delivery apparatus 100. A second flange 110 is disposed at the second end 108 of the gas delivery apparatus 100. Each of the first and second flanges 106, 110, may be vacuum flanges to facilitate forming a vacuum tight seal with adjacent components, as discussed further below.

The first flange 106 includes one or more first openings 112, corresponding to a first end of the first conduit 102 (at the first end 104 of the apparatus) and any other gas lines disposed through the gas delivery apparatus 100. The second flange 110 include one or more second openings 114, corresponding to a second end of the first conduit 102 (at the second end 108 of the apparatus) and any other gas lines disposed through the gas delivery apparatus 100.

A central portion of the first conduit 102 is disposed between the first flange 106 and the second flange 110. In some embodiments, the gas delivery apparatus 100 may comprise a plurality of conduits. For example, as depicted in FIG. 1, the gas delivery apparatus 100 comprises the first conduit 102 and a second conduit 118. In some embodiments, the second conduit is also a metal conduit. In embodiments where the second conduit 118 is a metal conduit, the second conduit 118 can be selected from the same parameters as disclosed herein for the first conduit 102. In some embodiments, the second conduit 118 is the same as the first conduit 102. In some embodiments, the second conduit 118 is different than the first conduit 102. In some embodiments, the second conduit may be a dielectric conduit. Each of the conduits extending through the apparatus (e.g., the first conduit 102, the second conduit 118, and any other conduits) extend between respective ones of the first openings 112 and the second openings 114. In other words, one conduit extends from one first opening 112 to corresponding one second opening 114 and each conduit extends between different pairs of first and second openings 114.

In some embodiments, for example as depicted in FIG. 1, each one of the first flange 106 and second flange 110 may include mounting holes 122. The mounting holes 122 may be provided to facilitate installation and coupling of the gas delivery apparatus 100 to a process chamber and a gas source, as described in more detail below.

The first conduit 102 is formed from a conductive material. For example, the first conduit 102 may be made of a metal, such as aluminum or stainless steel. In some embodiments, one end of the conductive gas line may be grounded while the other end is coupled to a current source. For example, the first end 104 may be coupled to ground and the second end 108 may be coupled to an RF power source to providing RF current to the first conduit 102.

The gas delivery apparatus 100 further includes a block of ferrite material 124 that surrounds at least a portion of the conductive gas line (e.g., the first conduit 102). In some embodiments, and as depicted in FIG. 1, the block of ferrite material 124 is disposed between the first flange 106 and the second flange 110 to enclose the central portion of the gas delivery apparatus 100. In FIG. 1, only a portion the block of ferrite material 124 is illustrated, such that the first conduit 102 and the second conduit 118 disposed in the block of ferrite material 124 can be seen. As shown in more detail for example in FIGS. 2 and 3, the block of ferrite material 124 completely surrounds the first conduit 102, and when present, any other conductive conduits, such as the second conduit 118. The block of ferrite material 124 advantageously limits or prevents plasma formation and arcing within the conductive gas line (e.g., the first conduit 102).

Figure 2:
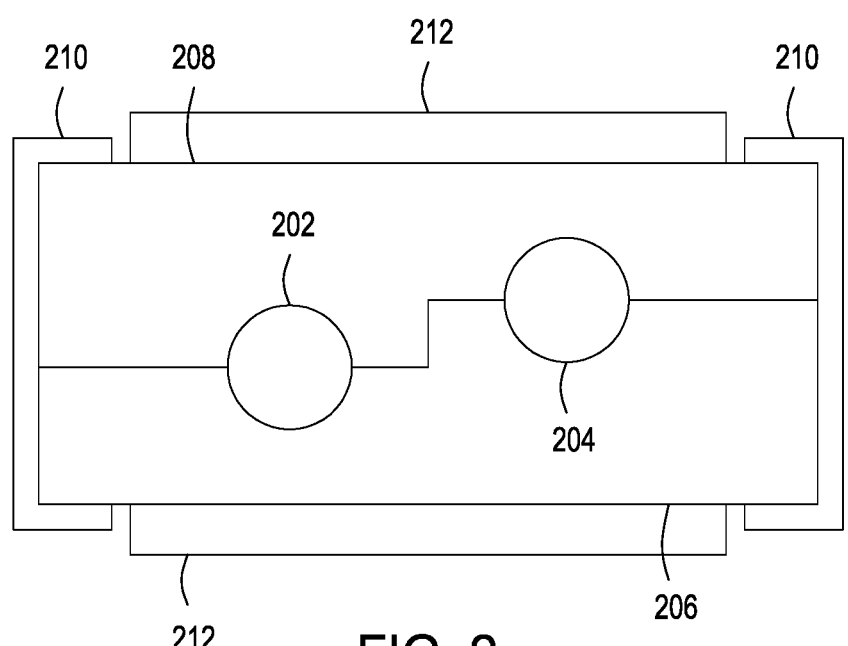
FIG. 2 depicts a schematic end view of a gas delivery apparatus in accordance with embodiments of the present disclosure.

FIG. 2 depicts a schematic side view of the block of ferrite material 124. The block of ferrite material 124 includes one or more openings disposed through the block of ferrite material 124 corresponding to the conduits extending through the gas delivery apparatus 100 (e.g., the first and second conduits 102, 118, as illustrated). FIG. 2 is an illustration of an embodiment of the block of ferrite material 124 having two openings, a first opening 202 and a second opening 204 disposed through the block of ferrite material 124. In some embodiments, for example, as depicted in FIG. 2, the block of ferrite material 124 may comprise a first portion 206 and a second portion 208 coupled to the first portion 206, wherein the first opening 202 is at least partially defined in each of the first portion 206 and the second portion 208. In other words, the first portion 206 and the second portion 208 comprise separate halves of the block of ferrite material 124 that together can be assembled to completely surround the conductive lines (e.g., the first and second conduits 102, 118).

The block of ferrite material 124 may be formed from iron oxide containing compounds. In some embodiments the iron oxide containing compounds may further include zinc additives. For example, in some embodiments, the block of ferrite material 124 may comprise a nickel-zinc ferrite, such as comprising iron oxide, nickel, and zinc, a manganese-zinc ferrite, such as comprising iron oxide, manganese, and zinc, or the like. The block of ferrite material 124 is configured to block RF currents from reaching the interior of the conductive gas lines extending through the gas delivery apparatus 100. For example, the block of ferrite material may block RF currents having frequencies in the range of about 0.1 MHz to about 70 MHz, for example about 13.56 MHz. The particular material and configuration of the block of ferrite material may be selected dependent upon the RF frequency.

Figure 3:
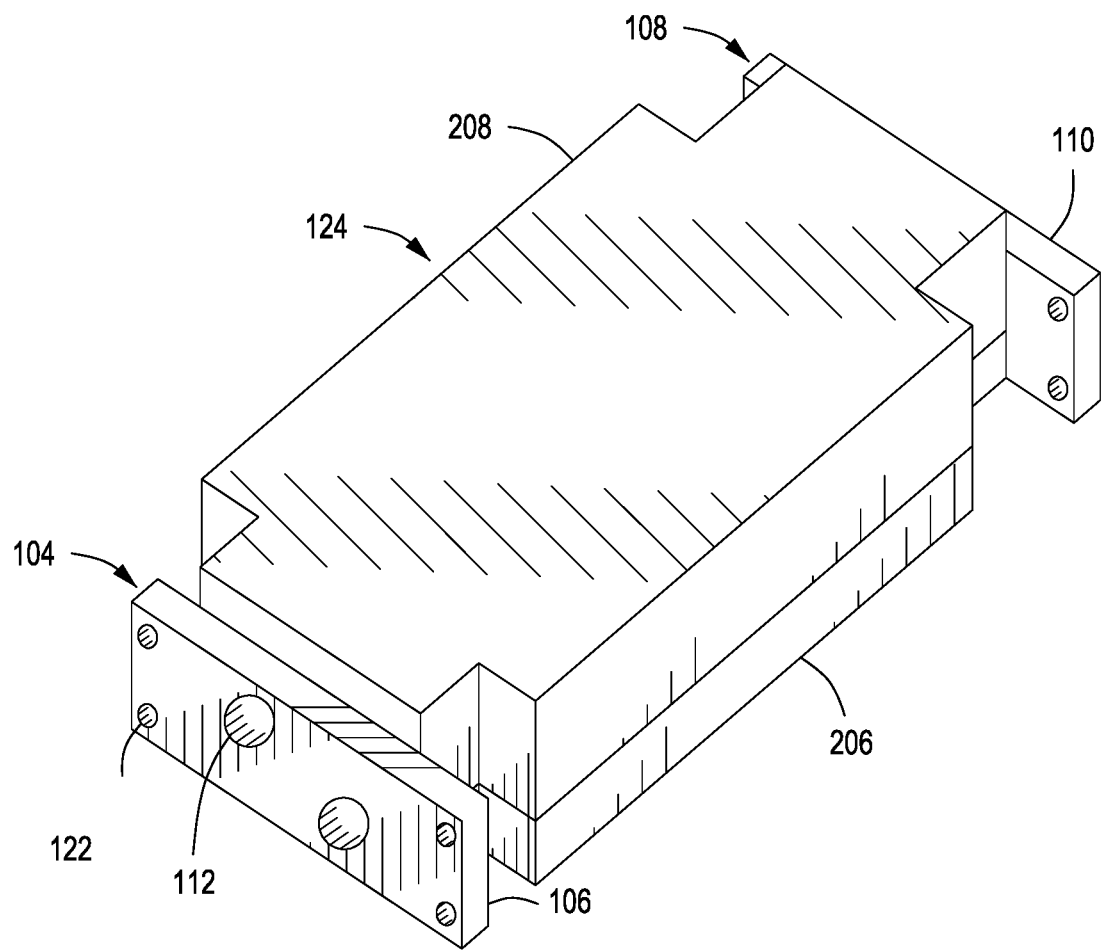
FIG. 3 depicts a top perspective view of an assembled gas delivery apparatus in accordance with embodiments of the present disclosure.

FIG. 3 depicts a top perspective view of an assembled gas delivery apparatus 100. As illustrated in FIG. 3 and recited above, the block of ferrite material 124 is disposed between the first flange 106 and the second flange 110 such that the conductive gas line is enclosed by the block of ferrite material 124. Specifically, FIG. 3 illustrates the first portion 206 and the second portion 208 coupled together such that the exemplary first conduit 102 and second conduit 118 (shown in FIG. 1) coupled to the first flange 106 and the second flange 110, are respectively disposed through the first opening 202 and the second opening 204.

In some embodiments, the gas delivery apparatus 100 may include a non-conductive spacer material (not shown) disposed between the first conduit 102 and the block of ferrite material 124. In some embodiments, the non-conductive material may be formed according to the configuration of the first conduit 102. For example, non-conductive cylindrical tubular brackets may be disposed around the first conduit 102 and the second conduit 118 to prevent direct contact between the first conduit 102 and the block of ferrite material 124. In some embodiments, the non-conductive spacer material may be a non-conductive polymer, for example, polytetrafluoroethylene (PTFE).

Figure 4:
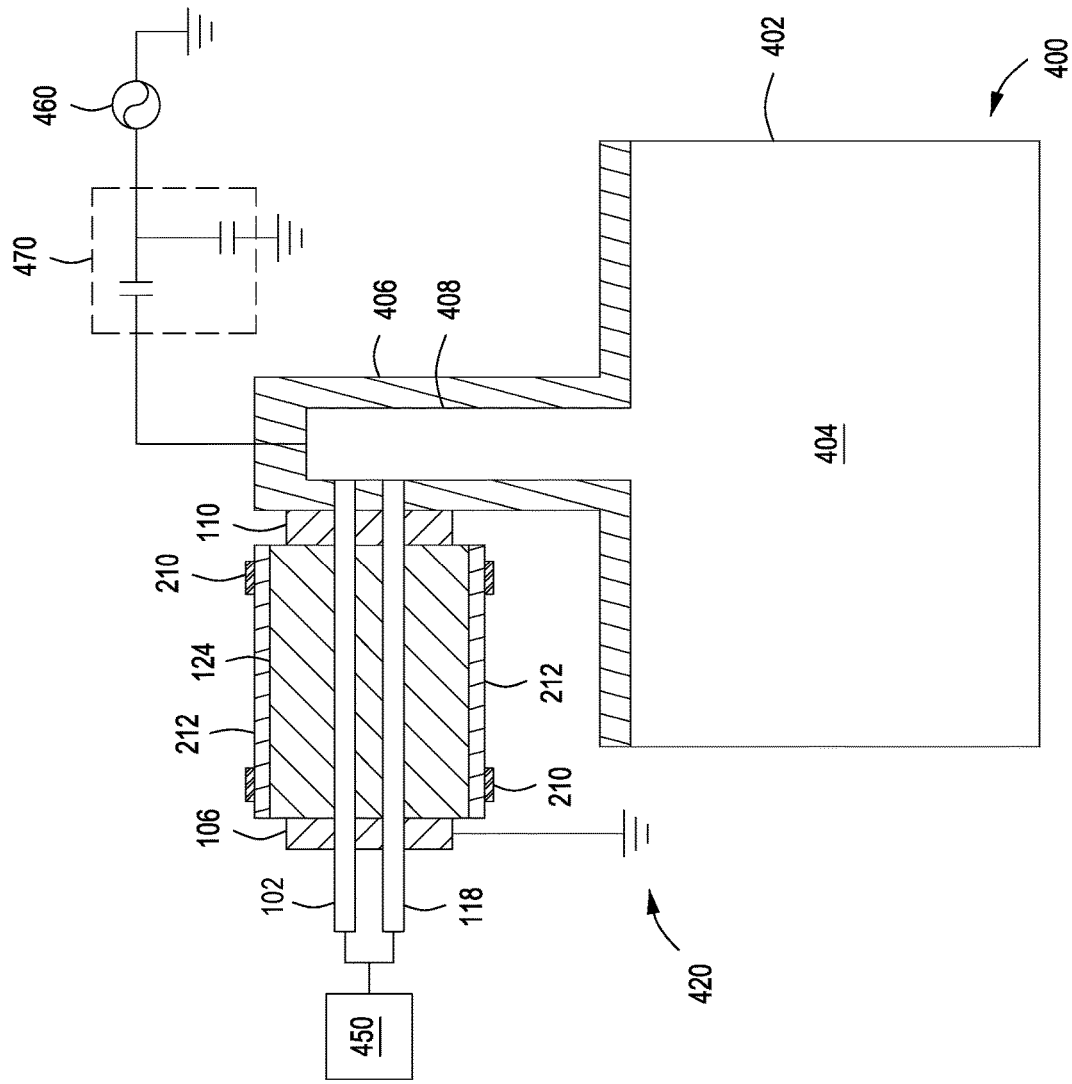
FIG. 4 depicts a schematic side view of a process chamber having a gas delivery apparatus for delivering gases to the process chamber in accordance with embodiments of the present disclosure.

In some embodiments, and as depicted in FIGS. 2 and 4, the gas delivery apparatus 100 may also include a non-conductive bracket 210 to secure the block of ferrite material 124 to the gas delivery apparatus 100. For example, the first portion 206 and the second portion 208 of the block of ferrite material 124 can be clamped together and around the first and second conduits 102, 118 by the non-conductive bracket 210. In some embodiments, the non-conductive bracket may be fabricated from a non-conductive polymer, for example, polytetrafluorethylene (PTFE).

In some embodiments, and as depicted in FIGS. 2 and 4, the gas delivery apparatus 100 may also include a heat transfer apparatus 212 for controlling the temperature of the first conduit 102. For example, the heat transfer apparatus 212 may be a resistive heater disposed in or around the first conduit 102, or as depicted in FIGS. 2 and 4, around the block of ferrite material 124. Alternatively or in combination, the heat transfer apparatus 212 may be (or may further include) a cooling jacket disposed around the first conduit 102, or as depicted in FIGS. 2 and 4, around the block of ferrite material 124. The heat transfer apparatus 212 advantageously facilitates control of the temperature of the gas delivery apparatus 100, which facilitates control over the temperature of the gases flowing through the gas delivery apparatus 100. For example, removing excess heat generated by flow of RF current, premature breakdown of precursors flowing in the gas delivery apparatus 100 can be mitigated or avoided.

FIG. 4 depicts a schematic side view of the gas delivery apparatus 100 configured to deliver one or more process gases to a process chamber 400. The process chamber 400 comprises a chamber body 402, a processing volume 404, and a chamber lid 406. In some embodiments, as depicted in FIG. 4, the chamber lid 406 may further include a gas inlet pipe 408 for receiving gases from the gas delivery apparatus 100, coupled thereto, and to deliver the gases to the processing volume 404.

The process chamber 400 receives RF current from an RF power source 460 coupled to the process chamber, for example, via an impedance tuning network 470. In some embodiments in accordance with the present disclosure, for example, as depicted in FIG. 4, the RF power source 460 is coupled to the process chamber 400 via the chamber lid 406.

As depicted in FIG. 4, the first end of the gas delivery apparatus 100 is coupled to a gas source 450 via the first flange 106. For example, fasteners may be used to couple the gas delivery apparatus 100 to a corresponding flange of the gas source 450 through the mounting holes 122. The second end of the gas delivery apparatus 100 is coupled to the process chamber, for example to the chamber lid 406, via the second flange 110. For example, fasteners may be used to couple the gas delivery apparatus 100 to a corresponding flange or suitable mounting location of the process chamber 400 via mounting holes 122 in the second flange 110. The conductive line (e.g., the first conduit 102) is coupled to ground 420, for example, at the first end of the gas delivery apparatus 100, such as through the first flange 106.

As depicted in FIG. 4, the first conduit 102 couples the gas source 450 to the gas inlet pipe 408 for delivery of gases to the process chamber via the gas delivery apparatus 100. In the exemplary embodiment depicted in FIG. 4, the first conduit 102 and the second conduit 118 couple the gas source 450 to the gas inlet pipe 408. FIG. 4 also illustrates the block of ferrite material 124 surrounding the first conduit 102 and the second conduit 118.

In some embodiments, the temperature of the chamber lid 406 may be controlled by the heat transfer apparatus for controlling the temperature of the first conduit 102. In some embodiments, alternatively or in combination, a separate heat transfer apparatus may be provided to control the temperature of the chamber lid 406.

In operation, one or more gases are flowed from the gas source 450 to the process chamber 400 via the gas delivery apparatus 100. For example, the one or more gases may be process gas for forming a plasma and processing substrates inside the process chamber. In some embodiments, the one or more gases may be a metal-organic precursor for depositing metallic films on a substrate inside the process chamber 400.

While flowing the one or more gases, the RF power source 460 provides an RF current to the process chamber 400 via the chamber lid 406 and the second flange 110 coupled to the chamber lid 406. The RF current flows along the outside of the gas delivery apparatus 100 while the one or more gases flow inside the first conduit 102, for example, inside the first conduit 102 and the second conduit 118, as depicted in FIG. 4. The block of ferrite material 124 blocks the RF current from forming electromagnetic fields inside the first conduit 102, such that the electromagnetic field within the first conduit 102 (e.g., within the first conduit 102 and the second conduit 118) is negligible. For example, in some embodiments, the electromagnetic field within the first conduit 102 (e.g., within the first conduit 102 and the second conduit 118), may be zero or substantially zero.

In some embodiments, the temperature of the chamber lid 406 may be controlled to further avoid premature gas breakdown which may lead to a parasitic plasma formation between the gas delivery apparatus 100 and the RF power source 460, for example, between the first conduit 102 and the RF power source 460. In other embodiments, controlling the temperature of the chamber lid 406 may prevent condensation of gases inside the first conduit 102 or between the first conduit 102 and the RF power source 460.

Thus, embodiments of a gas delivery apparatus for providing a zero or substantially zero RF field inside the gas line between the gas feed-through and RF electrode of metal organic chemical vapor deposition (MOCVD) or plasma enhanced chemical vapor deposition (PECVD) systems and methods of using the same have been provided herein.

While the foregoing is directed to embodiments of the present disclosure, other and further embodiments of the disclosure may be devised without departing from the basic scope thereof.

The invention claimed is:

1. A gas delivery apparatus for use in a radio frequency (RF) processing apparatus, comprising:
   a conductive gas line having a first end and a second end;
   a first flange coupled to the first end;
   a second flange coupled to the second end, wherein the conductive gas line extends through and between the first and second flanges; and
   a continuous block of ferrite material completely enclosing the conductive gas line between the first and second flanges.

2. The gas delivery apparatus of claim 1, wherein the block of ferrite material comprises a first portion and a second portion coupled to the first portion, wherein each of the first and second portions partially define an opening through which the conductive gas line is disposed.

3. The gas delivery apparatus of claim 1, further comprising a plurality of conductive gas lines, wherein the block of ferrite material surrounds each of the conductive gas lines.

4. The gas delivery apparatus of claim 3, wherein the plurality of conductive gas lines is two conductive gas lines.

5. The gas delivery apparatus of claim 1, wherein the gas delivery apparatus further comprises a heat transfer apparatus for controlling the temperature of the conductive gas line.

6. The gas delivery apparatus of claim 1, wherein the block of ferrite material is a nickel-zinc ferrite or a manganese-zinc ferrite.

7. The gas delivery apparatus of claim 1, wherein the conductive gas line comprises aluminum or stainless steel.

8. The gas delivery apparatus of claim 1, further comprising non-conductive brackets disposed around the block of ferrite material.

9. The gas delivery apparatus of claim 8, wherein the non-conductive brackets are made of polytetrafluorethylene (PTFE).

10. An apparatus for delivering one or more process gas to a process chamber comprising:
   an RF power source for providing RF current to a process chamber, wherein the RF power source is coupled to the process chamber;
   a gas source for providing a gas to a processing volume of the process chamber; and
   a gas delivery apparatus coupled between the gas source and the RF power source, the gas delivery apparatus comprising:
      a conductive gas line having a first end and a second end;
      a first flange coupled to the first end and coupling the conductive gas line to the gas source;
      a second flange coupled to the second end and coupling the conductive gas line to the process chamber, wherein the conductive gas line extends through and between the first and second flanges; and
      a continuous block of ferrite material completely enclosing the conductive gas line between the first and second flanges.

11. The apparatus of claim 10, wherein the first end is coupled to ground and wherein the second end is coupled to the RF power source via the process chamber.

12. The apparatus of claim 10, further comprising non-conductive brackets disposed around the block of ferrite material.

13. The apparatus of claim 10, wherein the block of ferrite material comprises an opening through which the conductive gas line is disposed.

14. The apparatus of claim 10, wherein the block of ferrite material is a nickel-zinc ferrite or a manganese-zinc ferrite.

15. The apparatus of claim 10, wherein the conductive gas line comprises aluminum or stainless steel.

16. The apparatus of claim 10, further comprising a plurality of conductive gas lines, wherein the block of ferrite material surrounds each of the conductive gas lines.

* * * * *